US007456545B2

(12) United States Patent
Huber et al.

(10) Patent No.: US 7,456,545 B2

(45) Date of Patent: Nov. 25, 2008

(54) METHOD FOR DETERMINING THE ACTIVATION VOLTAGE OF A PIEZOELECTRIC ACTUATOR OF AN INJECTOR

(75) Inventors: Andreas Huber, Steinheim (DE); Kai Sutter, Stuttgart (DE); Marco Gangi, Esslingen (DE); Jens Bloemker, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 99 days.

(21) Appl. No.: 10/567,617

(22) PCT Filed: Jul. 10, 2004

(86) PCT No.: PCT/DE2004/001504

§ 371 (c)(1), (2), (4) Date: Aug. 21, 2006

(87) PCT Pub. No.: WO2005/026516

PCT Pub. Date: Mar. 24, 2005

(65) Prior Publication Data

US 2007/0182280 A1 Aug. 9, 2007

(30) Foreign Application Priority Data

Sep. 1, 2003 (DE) ................................ 103 40 137

(51) Int. Cl.

*H01L 41/09* (2006.01)

(52) U.S. Cl. .................................. 310/316.03; 310/317

(58) Field of Classification Search ............ 310/316.01, 310/316.03, 317

See application file for complete search history.

(56) References Cited

U.S. PATENT DOCUMENTS

| | | | | |
|---|---|---|---|---|
| 6,784,596 | B2 * | 8/2004 | Rueger et al. | 310/316.03 |
| 2004/0169436 | A1 * | 9/2004 | Fukagawa et al. | 310/317 |

FOREIGN PATENT DOCUMENTS

| | | |
|---|---|---|
| DE | 199 30 309 | 1/2001 |
| DE | 100 32 022 | 1/2002 |
| DE | 101 46 747 | 4/2003 |
| DE | 101 55 391 | 5/2003 |
| EP | 1 138 909 | 10/2001 |
| EP | 1 172 541 | 1/2002 |

* cited by examiner

*Primary Examiner*—Thomas M Dougherty

(74) *Attorney, Agent, or Firm*—Kenyon & Kenyon LLP

(57) ABSTRACT

A method for determining the activation voltage of a piezoelectric actuator of at least one injector which is used to inject a liquid volume under high pressure into a cavity, in particular into a combustion chamber of an internal combustion engine, the activation voltage being varied as a function of the pressure used to pressurize the liquid volume. A drift of the activation voltage (voltage requirement) required for a predefined lift of a control valve of the injector is controlled on an injector-specific basis by controlling the difference between the cutoff-voltage threshold and the final steady-state voltage to a setpoint value predefined for one operating point.

7 Claims, 3 Drawing Sheets

METHOD FOR DETERMINING THE ACTIVATION VOLTAGE OF A PIEZOELECTRIC ACTUATOR OF AN INJECTOR

BACKGROUND INFORMATION

German Patent Application No. DE 100 32 022 describes a method for determining the activation voltage for a piezoelectric actuator of an injector, which provides for first measuring the pressure prevailing in a hydraulic coupler indirectly, prior to the next injection event. The pressure is measured in that the piezoelectric actuator is mechanically coupled to the hydraulic coupler, so that the pressure induces a corresponding voltage in the piezoelectric actuator. This induced voltage is used prior to the next injection event to correct the activation voltage, inter alia, for the actuator. An induced voltage that is too low is indicative of a missed injection. The injector is preferably used for injecting fuel for a gasoline or diesel engine, in particular for common-rail systems. In this context, the pressure prevailing in the hydraulic coupler also depends, inter alia, on the common-rail pressure, so that the activation voltage is varied as a function of the common-rail pressure. The voltage requirement of a piezoelectric actuator depends first and foremost on the pressure prevailing in the valve chamber, as well as on the coefficient of linear expansion of the piezoelectric actuator. The voltage required for properly operating the injector at one operating point is the so-called voltage requirement, i.e., the relationship between voltage and lift at a specific force which is proportional to the common-rail pressure.

German Patent No. DE 103 15 815.4 discusses deriving the active voltage requirement of an injector from the voltage difference between the maximum actuator voltage and the final steady-state voltage.

It is problematic in this regard, however, that the voltage requirement of an injector drifts over the service life of the injector. The effect of this drift is that the actuator voltage that is predefined as a function of one operating point does not ensure a proper operation of the injector at a predefined operating point. This leads to errors in the injection quantity which, in turn, cause negative exhaust-emission levels and negative noise emissions. In the least favorable case, a failure of the injection and thus of the injector may even occur, namely when the lift no longer suffices for opening an injection-nozzle needle.

Therefore, an object of the present invention is to compensate for this voltage requirement drift.

SUMMARY OF THE INVENTION

This objective is achieved by a method for determining the activation voltage of a piezoelectric actuator of an injector. The method according to the present invention makes it possible to compensate for the voltage requirement drift by adapting the setpoint voltage value, thereby ensuring that the required, nominal actuator excursion is attained and ensuring a proper and desired operation of the injector over the entire lifetime. In addition, by adapting the voltage requirement, the advantage is derived, in principle, that a very high voltage allowance is not needed for the activation, so that a considerable benefit is gained with respect to the power input/power loss. Moreover, the adaptation of the voltage requirement may also be used for diagnostic purposes, for example in order to output an error message in response to an unacceptably high drift of the voltage requirement.

The control of the voltage requirement drift is advantageously carried out during one driving cycle of a vehicle having the internal combustion engine, correction values ascertained during the driving cycle being stored in a non-volatile memory. This makes it feasible, in particular, for the correction values stored in the memory to be used in a later driving cycle, as initialization values for a further compensation of the voltage requirement drift.

To ensure that an adaptation is only carried out in response to an actual voltage requirement drift, i.e., that no readjustment is made in response to only temporary, relatively small deviations, caused, for example, by temperature effects, an enable logic is preferably provided, which enables an adaptation of the voltage requirement drift as a function of parameters characterizing the internal combustion engine and/or the injector.

These parameters include, for example, the temperature of the internal combustion engine and/or the common-rail pressure and/or the steady state of the voltage control and/or the state of the charging time control and/or the steady state of other secondary feedback control circuits and/or the number of injections and/or the control (activation) duration and/or the injection sequence per combustion cycle, i.e., effectively, the injection pattern (preinjection(s), main injection, post injection(s)).

The voltage requirement is compensated at various operating points very advantageously with respect to the common-rail pressure, the correction values being stored in correction characteristics maps, which are then also stored in the non-volatile memory, for example in an $E^2$-PROM.

DETAILED DESCRIPTION

Figure 1:
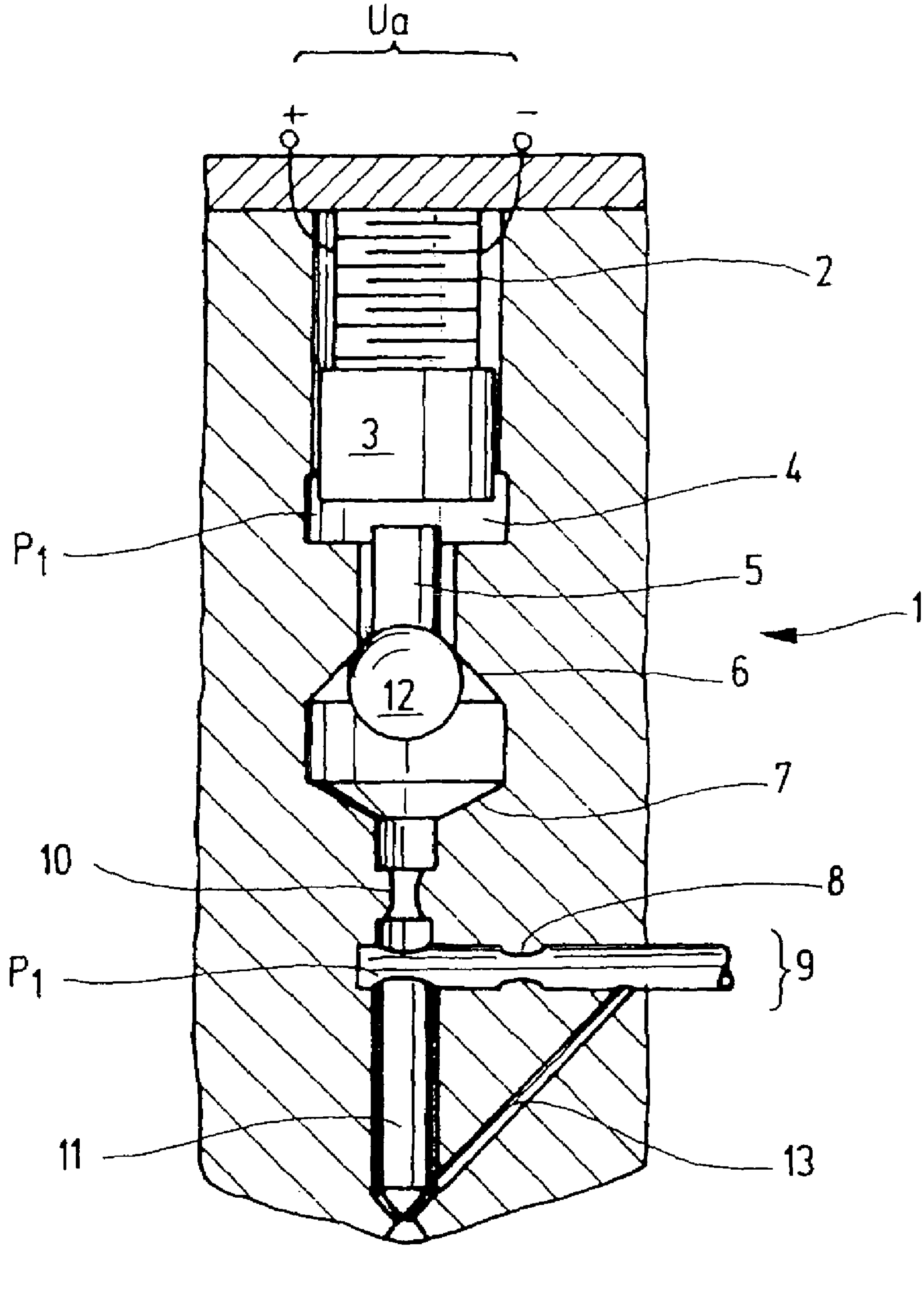
Fig.1 (related ART)
FIG. 1 shows the schematic design of an injector known from the related art.

FIG. 1 schematically depicts an injector 1, known from the related art, having a central bore. In the upper part, an actuating piston 3 having a piezoelectric actuator 2 is introduced into the central bore, actuating piston 3 being fixedly coupled to actuator 2. A hydraulic coupler 4 is upwardly delimited by actuating piston 3, while in the downward direction, an opening having a connecting channel to a first seat 6 is provided, in which a piston 5 having a valve-closure member 12 is situated. Valve-closure member 12 is designed as a double-closing control valve. It closes first seat 6 when actuator 2 is in the rest phase. In response to actuation of actuator 2, i.e., application of an activation voltage Ua to terminals +, −, actuator 2 actuates actuating piston 3 and, via hydraulic coupler 4, presses piston 5 having closure member 12 toward a second seat 7. Disposed in a corresponding channel, below the second seat, is a nozzle needle 11, which closes or opens the outlet in a high-pressure channel (common-rail pressure) 13, depending on which activation voltage Ua is applied. The high pressure is supplied by the medium to be injected, for example fuel for a combustion engine, via a supply channel 9; the inflow quantity of the medium in the direction of nozzle needle 11 and hydraulic coupler 4 is controlled via an inflow throttling orifice 8 and an outflow throttling orifice 10. In this context, hydraulic coupler 4 has the task, on the one hand, of boosting the lift of piston 5 and, on the other hand, of uncoupling the control valve from the static temperature-related expansion of actuator 2. The refilling of coupler 4 is not shown here.

The mode of operation of this injector is explained in greater detail in the following. In response to each activation of actuator 2, actuating piston 3 is moved in the direction of hydraulic coupler 4. Piston 5 having closure member 12, moves toward second seat 7. In the process, a portion of the medium, for example of the fuel, contained in hydraulic coupler 4 is forced out via leakage gaps. For that reason, hydraulic coupler 4 must be refilled between two injections, in order to maintain its operational reliability.

A high pressure, which in the case of the common-rail system may amount to between 200 and 2000 bar, for example, prevails across supply channel 9. This pressure acts against nozzle needle 11 and keeps it closed, preventing any fuel from escaping. If actuator 2 is actuated at this point in response to activation voltage Ua and, consequently, closure member 12 moved toward the second seat, then the pressure prevailing in the high-pressure region diminishes, and nozzle needle 11 releases the injection channel. $P_1$ denotes the so-called coupler pressure, as is measured in hydraulic coupler 4. A steady-state pressure $P_1$, which, for example, is 1/10 of the pressure prevailing in the high-pressure portion, ensues in coupler 4, without activation Ua. Following the discharging of actuator 2, coupler pressure $P_1$ is approximately 0 and is raised again in response to refilling.

At this point, the lift and the force of actuator 2 correlate with the voltage used for charging actuator 2. Since the force is proportional to the common-rail pressure, the voltage for a required actuator excursion must be adapted as a function of the common-rail pressure to ensure that seat 7 is reliably reached. The voltage required for properly operating the injector or injector 1 at one operating point is the so-called voltage requirement, i.e., the relationship between voltage and lift at a specific force which is proportional to the common-rail pressure. German Patent No. DE 103 15 815.4 discusses how the individual, active voltage requirement of an injector can be derived from the voltage difference between the maximum actuator voltage and the final steady-state voltage.

This voltage requirement drifts over the lifetime of injector 1. The effect of this drift is that the actuator voltage that is predefined as a function of one operating point no longer ensures a proper operation of injector 1 at the specified operating point, which leads to errors in the injection quantity, thereby entailing consequences for exhaust-emission levels/noise emissions, culminating in a failure of the injector, namely when the lift no longer suffices for opening nozzle needle 11. The method described in the following makes it possible to compensate for this voltage requirement drift on an injector-specific basis.

An idea underlying the present invention is to compensate for the voltage requirement drift by adapting the setpoint voltage value, thereby ensuring that the required, nominal actuator excursion is attained and enabling the proper and desired operation of injector 1 to be ensured over its entire lifetime. Thus, on the one hand, the functioning of actuator 2 is ensured, but on the other hand the injection quantity errors described above are also avoided.

In principle, by adapting the voltage requirement in this manner, the need is also eliminated for activation processes that require a very high voltage allowance. This is advantageous, in particular, with respect to the power input/power loss of a control system. Moreover, actuator 2 is subject to less wear, since there is no need for actuator 2 to be operated over an entire lifetime with a very large voltage allowance, which is associated with too high of a power surplus in the valve seat.

Moreover, by monitoring the correction intervention of the adaptation, a diagnostic may also be performed on the entire injector, for example when an unacceptably high drift of the voltage requirement is ascertained.

Figure 2:
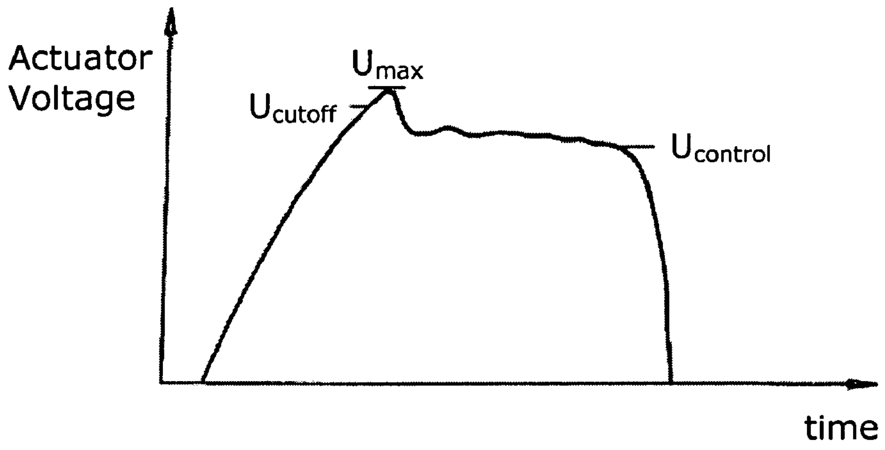
FIG. 2 schematically illustrates a graphic representation of the actuator voltage over time, during one activation.

The adaptation of the voltage requirement drift is based on automatically controlling the voltage difference between cutoff-voltage threshold $U_{cutoff}$ and the measured, final steady-state voltage $U_{control}$ (compare FIG. 2), in an injector-specific manner, to a setpoint value $\Delta U_{setpoint}$ which is required for one operating point and which correlates with the required actuator excursion of an injector that has not drifted, i.e., that is performing nominally. This control intervenes correctively by adapting the setpoint actuator voltage in an injector-specific manner, as is described in greater detail below in conjunction with FIG. 3.

An actuator setpoint voltage $U_{setpoint}$ is calculated in an arithmetic logic unit 310. During the driving cycle, difference $\Delta U_{actual}$ between cutoff voltage $U_{cutoff}$ and control voltage $U_{control}$ is continually determined. This difference $\Delta U_{actual}$ is compared to a predefined quantity $\Delta U_{setpoint}$, the difference between quantity $\Delta U_{setpoint}$ and $\Delta U_{actual}$ being determined in a node 320. This difference $e_{\Delta U}$ forms the input quantity for a PI controller, for example, in which various controllers 331, 332, 33*n* are provided for each of the individual cylinders. In these controllers, cylinder-specific correction signals S1, S2, $S_n$ are defined in each instance and output, n describing the number of cylinders.

The correction values are either multiplied by setpoint voltage $U_{setpoint}$ determined in arithmetic logic unit 310 or, alternatively, added to it, as indicated by nodes 341, 342. The thus ascertained corrected values $U_{setpointcorr}$ are fed to an actuator-voltage control device 350, which determines cutoff-voltage threshold $U_{cutoff}$. At this point, this cutoff-voltage threshold $U_{cutoff}$ is utilized, together with the ensuing final steady-state voltage $U_{control}$, in turn, to determine difference $\Delta U_{actual}$.

Figure 3:
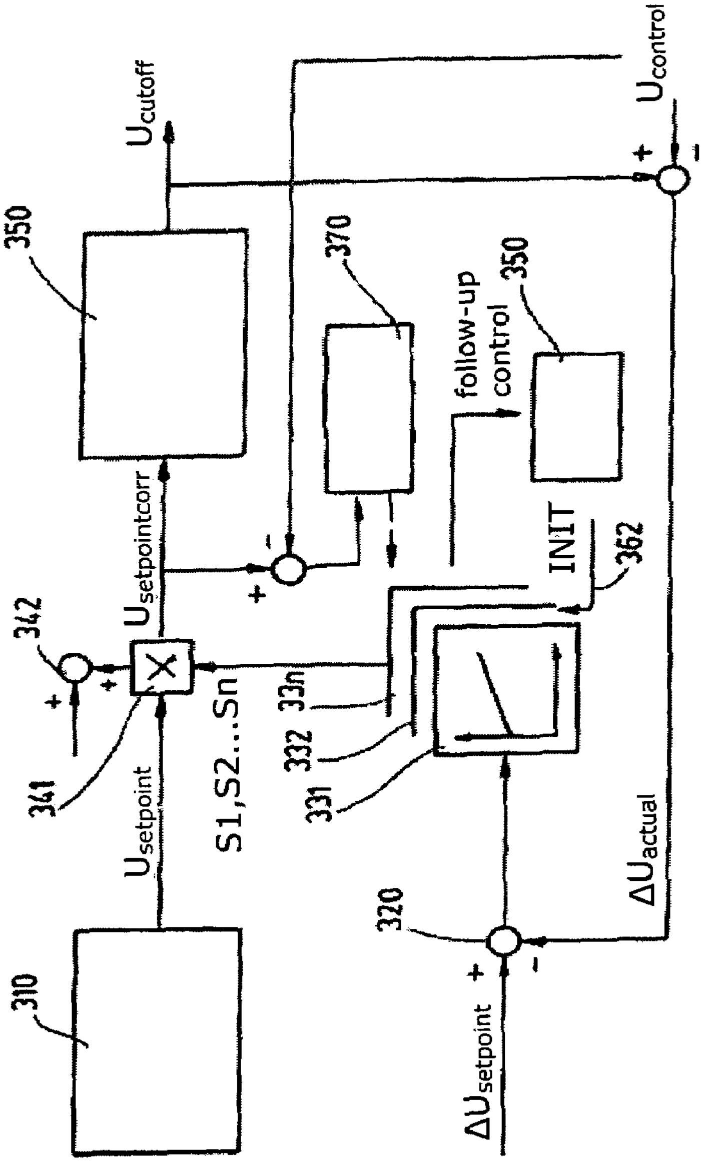
FIG. 3 schematically shows a block diagram of a control system that utilizes the method according to the present invention.

Correction values S1, S2, . . . $S_n$ learned during one driving cycle are preferably stored following termination of the driving cycle in a non-volatile memory 360, for example in an $E^2$-PROM, and used before the beginning of the subsequent driving cycle as initialization values for the further adaptation, as schematically depicted in FIG. 3 by an arrow 362 denoted by "INIT". It is noted at this point that, to calculate voltage difference $\Delta U_{actual}$ for the method described above, maximum voltage $U_{max}$ (compare FIG. 2) cannot be used, as described in German Patent No. DE 103 15 815.4, but rather cutoff-voltage threshold $U_{cutoff}$, since $U_{max}$ is not available as a usable quantity in a generally known engine control unit, in which this control is also executed. The voltage requirement drift is also compensated, however, when the cutoff voltage $U_{cutoff}$ quantity is used.

To ensure that the adaptation is only carried out in response to an actually existing voltage requirement drift, i.e., that controllers 331, 332, 33*n* only control in this case and not, for instance, in response to temporary, relatively small deviations, caused, for example, by temperature effects, by the dynamic operation, etc., an enable logic circuit is provided in a circuit unit 370, which monitors typical parameters for enabling the adaptation. These parameters of the internal combustion engine and/or of the injector include, for example, the temperature of the internal combustion engine and/or the common-rail pressure and/or the steady state of the voltage control and/or the state of the charging time control and/or the steady state of other secondary feedback control circuits and/or the number of injections and/or the control (activation) duration and/or the injection sequence per combustion cycle, i.e., effectively, the injection pattern (preinjection(s), main injection, post injection(s)). A steady state of the voltage control is verified, for example, by comparing quantities $U_{setpointcorr}$ and $U_{control}$. Only if $U_{setpointcorr}$ and $U_{control}$ conform, are PI controllers 331, 332 . . . 33*n* enabled by circuit unit 370, so that difference $\Delta U_{actual}$ may be adapted to $\Delta U_{setpoint}$, as described above, thereby making it possible for the voltage requirement drift to be adapted.

If, on the other hand, the test reveals that the actuator voltage control is not steady-state, thus, when $U_{setpointcorr}$ deviates from $U_{control}$, PI controllers 331, 332, . . . 33*n* are deactivated by enable-logic circuit unit 370, and correction values S1, S2, . . . $S_n$ remain unchanged, i.e., are, to a certain extent, frozen. The setpoint voltage value continues to be corrected at switching points 341/342 using values S1, S2, . . . $S_n$ learned up to that point. Such a "freezing" of the correction values is possible since the injector drift occurs very slowly.

The method described above may initially be carried out only at one operating point (common-rail pressure), and the acquired correction values used for all operating points. To enhance the accuracy, the method may also be carried out at a plurality of different operating points (common-rail pressures).

Moreover, it should be pointed out that the comparison of an injector-specific correction value $S_1$, $S_2$, . . . $S_3$, which represents a measure of the deviation of the voltage requirement from the standard, to a predefinable threshold value, may additionally be used for diagnostic purposes. In this manner, it is possible to diagnose the system including actuator 2, coupler 4, and the control valve, which is constituted of valve-closure member 12.

What is claimed is:

1. A method for determining an activation voltage of a piezoelectric actuator of at least one injector which is used to inject a liquid volume under high pressure into a cavity, the method comprising:

varying the activation voltage as a function of a pressure used to pressurize the liquid volume; and controlling a drift of the activation voltage required for a predefined lift of a control valve of the injector on an injector-specific basis by controlling a difference between a cutoff-voltage threshold and a final steady-state voltage to a setpoint value for the difference between the cutoff-voltage threshold and the final steady-state voltage predefined for one operating point.

2. The method according to claim 1, wherein the liquid volume is injected into a combustion chamber of an internal combustion engine.

3. The method according to claim 2, wherein the control is carried out during one driving cycle of a vehicle having the internal combustion engine, and further comprising storing correction values ascertained during the driving cycle in a non-volatile memory.

4. The method according to claim 3, wherein the correction values stored in the non-volatile memory are used in a later driving cycle as initialization values for a control in the later driving cycle.

5. The method according to claim 2, further comprising enabling the control as a function of parameters characterizing at least one of the internal combustion engine and the injector.

6. The method according to claim 5, wherein the enabling takes place as a function of at least one of the following parameters: a temperature of the internal combustion engine, a common-rail pressure, a steady state of a charging time control, a steady state of a voltage control, an activation duration, a number of injections, an injection sequence, and a system deviation of secondary control devices.

7. The method according to claim 1, wherein the control is ascertained at various operating points, and further comprising storing correction values in correction characteristics maps.

* * * * *